(12) United States Patent
Broeckmann (10) Patent No.: US 10,809,292 B2
(45) Date of Patent: Oct. 20, 2020

(54) METHODS AND CIRCUIT ARRANGEMENTS FOR LOCALIZING A FAULT LOCATION ON AN ELECTRIC LINE BASED ON TIME DOMAIN REFLECTOMETRY

(71) Applicant: BENDER GMBH & CO. KG, Gruenberg (DE)

(72) Inventor: Eckhard Broeckmann, Giessen (DE)

(73) Assignee: BENDER GMBH & CO. KG, Gruenberg (DE)

( * ) Notice: Subject to any disclaimer, the term of this patent is extended or adjusted under 35 U.S.C. 154(b) by 90 days.

(21) Appl. No.: 16/131,093

(22) Filed: Sep. 14, 2018

(65) Prior Publication Data
US 2019/0086466 A1 Mar. 21, 2019

(30) Foreign Application Priority Data
Sep. 21, 2017 (DE) .......................... 10 2017 216 771

(51) Int. Cl.
*G01R 31/11* (2006.01)
*G01R 31/08* (2020.01)

(52) U.S. Cl.
CPC ............ *G01R 31/11* (2013.01); *G01R 31/085* (2013.01); *G01R 31/088* (2013.01)

(58) Field of Classification Search
CPC .... G01R 31/11; G01R 31/085; G01R 31/086; G01R 31/088
See application file for complete search history.

(56) References Cited

U.S. PATENT DOCUMENTS

| | | | | |
|---|---|---|---|---|
| 5,323,114 A | * | 6/1994 | Nagamune | .......... G01S 13/0209 324/334 |
| 5,748,891 A | * | 5/1998 | Fleming | .................. G01S 1/045 342/132 |
| 5,926,263 A | * | 7/1999 | Lynch | .................. H04B 10/071 356/73.1 |
| 5,963,312 A | * | 10/1999 | Roberts | ................ H04B 10/077 250/227.17 |
| 6,820,225 B1 | * | 11/2004 | Johnson | .................. H04L 43/50 324/76.11 |
| 2003/0125893 A1 | | 7/2003 | Furse | |
| 2005/0289408 A1 | | 12/2005 | Jani et al. | |

(Continued)

FOREIGN PATENT DOCUMENTS

| | | |
|---|---|---|
| CN | 1252966 C | 4/2006 |
| CN | 2819231 Y | 9/2006 |

(Continued)

OTHER PUBLICATIONS

English Translation Abstract of CN106443191A dated Feb. 22, 2017.

(Continued)

*Primary Examiner* — Patrick Assouad
*Assistant Examiner* — Demetrius R Pretlow
(74) *Attorney, Agent, or Firm* — King & Schickli, PLLC (57) ABSTRACT

The invention relates to methods and to circuit arrangements for localizing a fault location on an electric line based on time-domain reflectometry. The presently described methods and circuit arrangements serve for localizing an interference location, in particular an insulation fault, on an electric line by using methods of time-domain reflectometry.

7 Claims, 8 Drawing Sheets

(56) References Cited

U.S. PATENT DOCUMENTS

| | | |
|---|---|---|
| 2006/0039322 A1 | 2/2006 | Furse et al. |
| 2006/0097730 A1* | 5/2006 | Park .................... G01R 31/11 324/534 |
| 2006/0123289 A1* | 6/2006 | Williams ............ G01R 31/088 714/724 |
| 2007/0194796 A1 | 8/2007 | Harrison et al. |
| 2010/0290035 A1* | 11/2010 | Wang .................... G01B 11/02 356/73.1 |
| 2014/0071436 A1* | 3/2014 | Cyr .................. G01M 11/3163 356/73.1 |
| 2014/0369225 A1* | 12/2014 | Burchard ................ H04J 3/14 370/252 |
| 2015/0188626 A1* | 7/2015 | Viswanathan ....... H04B 10/071 398/21 |
| 2015/0295598 A1* | 10/2015 | Hellmann ............ H04B 17/101 370/242 |
| 2015/0318879 A1* | 11/2015 | Entsfellner .......... H04B 1/0475 375/300 |
| 2017/0176511 A1* | 6/2017 | Moell .................... G01R 31/11 |

FOREIGN PATENT DOCUMENTS

| | | |
|---|---|---|
| CN | 203149060 U | 8/2013 |
| CN | 106443191 A | 2/2017 |
| DE | 60103779 T2 | 7/2005 |
| DE | 102015122128 A1 | 6/2017 |
| EP | 1193907 A2 | 4/2002 |
| WO | 2004070398 a2 | 8/2004 |

OTHER PUBLICATIONS

English Translation Abstract of CN2819231Y dated Sep. 20, 2006.
English Translation Abstract of CN203149060U dated Aug. 21, 2013.

* cited by examiner

METHODS AND CIRCUIT ARRANGEMENTS FOR LOCALIZING A FAULT LOCATION ON AN ELECTRIC LINE BASED ON TIME DOMAIN REFLECTOMETRY

The disclosure of German Patent Application no. 10 2017 216 771.8, filed Sep. 21, 2017, is incorporated herein by reference

TECHNICAL FIELD

The invention relates to methods and to circuit arrangements for localizing a fault location on an electric line based on time-domain reflectometry.

The presently described methods and circuit arrangements serve for localizing an interference location, in particular an insulation fault, on electric lines by using methods of time-domain reflectometry.

BACKGROUND

Known methods of time-domain reflectometry are based on feeding a measuring pulse (transmission signal) into the line and receiving reflected pulses (reflection signals) based on line interferences and evaluating said reflected pulses regarding their duration and amplitude in order to localize a fault location on the line.

Each interference location in form of a change of the electric impedance, which refers to a length and is constant on a homogenous line, poses a discontinuity of the characteristic impedance, i.e. an impedance fault mismatch.

At the location of the discontinuity (fault location), a portion of the supplied measuring pulse, which runs towards the interference location, is reflected and a returning reflection signal is generated, which can be captured as a quantitative and qualitative norm for the existence of an interference location on the line. In particular the distance of the fault location can be determined by means of correlation calculations and by determining the signal propagation delay when the expansion speed is known.

A disadvantage of known concepts based on time-domain reflectometry is that the transmission signal is often supplied having an amplitude unadjusted to the mains impedance of the electric line (loop impedance between the two conductors of an electric line).

A high amplification of the transmission signal does have the advantage of a good signal-to-noise ratio but can lead to a high EMC total load (electromagnetic compatibility) during regular operation of the electric installation. In order to adhere to EMC threshold values, a low amplification of the transmission signal is required, which also involves a lower signal-to-noise ratio.

Moreover, the mains operator can be forced to take the electric installation offline in order to localize the fault since a longer measuring time can be expected during the continuous operation of the grid when using time-domain reflectometry methods so as to eliminate interfering influences, which are caused by operation and by current consumers, by means of signal averaging.

Furthermore, known methods use pulse sequences having good correlation properties, e.g. a distinct maximum of its autocorrelation function (ACF) (peak-shaped autocorrelation function). However, these signals inherently comprise a wide spectrum due to principles relating to signal theory. This spectral spread strains the line with EMC interferences on a broadband scale.

Another disadvantage is that the material constants of electric lines have a frequency dependency (dispersion), which leads to delay distortions in particular in broadband signals. Due to the blurring of the transmitted signal pulses, an uncertainty therefore arises in the delay determination.

Furthermore, known concepts of time-domain reflectometry are based on forming the cross correlation between the unprocessed pseudorandom pulse sequence (PN sequence or maximal length sequence) generated in the signal generator and the received reflection signal. Systematic effects of the pulse distortion, such as the pulse distortion via being coupled to the grid on the transmission side, via the complex-valued grid impedance, via being coupled to the grid on the receiver side, and via the low-pass effect of the line, are not considered in this context and can lead to false evaluations.

SUMMARY

The objective of the present invention is therefore to design a method and a system which are based on time-domain reflectometry and enable reliably localizing a fault location on the electric line while taking into account the electromagnetic compatibility and the expansion conditions on electric lines. This objective is attained by a first method for localizing a fault location on an electric line according to a method of time-domain reflectometry, which has the following method steps: generating a pseudorandom pulse sequence of the length M; generating an ideal transmission signal from the pseudorandom pulse sequence by limiting a frequency spectrum of the pseudorandom pulse sequence; transmitting the ideal transmission signal by means of a variably pre-settable transmission amplification; receiving and recording a real transmission signal by means of a first settable reception amplification while transmitting the ideal transmission signal; switching the first settable reception amplification on a second settable reception amplification which is greater than the first settable reception amplification; receiving a reflection signal by means of the second settable reception amplification; computing a cross-correlation function between the received real transmission signal and the received reflection signal; and determining the fault location on the electric line by evaluating the cross-correlation function by means of a signal propagation observation.

By carrying out the first method according to the invention, the objective is further attained by a first circuit arrangement for localizing a fault location on an electric line, which is characterized by a signal generator for generating a pseudorandom pulse sequence; a filtering unit for limiting a frequency spectrum of the pseudorandom pulse sequence; a transmission amplifier having a variably pre-settable transmission amplification and a transmission coupling circuit; a reception amplifier having a variably pre-settable and switchable reception amplification and a reception coupling circuit; a correlation receiver for computing a cross-correlation function between the received real transmission signal and the received reflection signal; and an evaluation unit for determining the fault location on the electric line.

For this purpose, a pseudorandom pulse sequence of the length M is generated in the signal generator. This pulse sequence is a temporally limited time-continuous signal and is made of a sequence of M square pulses which are evaluated using a binary pseudorandom code sequence of the length M. Such a code sequence leads to correlation properties of the pulse sequence (in the time domain), which are characterized by a desired peak-shaped autocorrelation function. However, a pulse sequence thus constructed also comprises a spectral spread which can lead to broadband EMC interfering influences on the line.

In order to weaken these interferences, an ideal transmission signal is generated for being fed into the electric line from the pseudorandom pulse sequence by limiting the frequency spectrum—further pulse distortions via interfering influences on the transmission distance still remain unconsidered at this location.

Another advantage of limiting the band is the low requirement to the bandwidth of transmission and reception amplifiers.

The ideal transmission signal limited in band can be a narrowband low-pass signal or a narrowband band-pass signal.

The frequency spectrum is limited preferably in a digital filtering unit relating to software.

In a next step the ideal transmission signal is switched by a transmission amplifier using a variably pre-settable transmission amplification via a transmission coupling switch on the electric line.

The advantage of this active transmission coupling having a variably pre-settable transmission amplitude in particular is that the respective arisen grid impedance can be adjusted with the aim to contain the line-bound interference load in the sense of the electromagnetic compatibility (EMC).

The ideal transmission signal is subjected to a transformation process when being supplied and transferred, said transformation process being characterized mainly by the pulse distortions in the transmission coupling circuit, in the complex-valued grid impedance and by the pulse distortion in a reception coupling circuit.

A fundamental idea of the invention at hand presently is based on using not the pseudorandom pulse sequence as a reference for a correlation with the received reflection signal but instead using a real transmission signal which has been derived from the ideal transmission signal and already takes into account the pulse distortions at the location of the supply.

While transmitting the ideal transmission signal, the ideal transmission signal, which has been altered by the pulse distortions, is received and recorded as a real transmission signal via the active reception coupling circuit by means of a first settable reception amplification.

The reflection signal is then correlated to the already distorted transmission signal instead of to the generally used pseudorandom pulse sequence. Since the correlation is a norm for the similarity of two signals, the usage of the real transmission signal leads to a cross-correlation function having a distinct unambiguous maximal value and thus to a reliable evaluation.

While transmitting the ideal transmission signal, the real transmission signal is received by means of first settable reception amplification, which is measured such that no override arises in a reception amplifier since the received real transmission signal comprises an amplitude not weakened due to a line attenuation as compared to the received reflection signal.

After receiving the real transmission signal, the first settable reception amplification is switched in the reception amplifier to a second settable reception amplification which is greater than the first settable reception amplifier. Thus the subsequently arriving, weakened reflection signal is accommodated. The reception amplifier undertakes switching the amplifier directly after transmitting the ideal transmission signal in a very short switching phase.

Subsequently, the cross-correlation function between the received real transmission signal and the received reflection signal is computed in a correlation receiver.

In an evaluation unit, the fault location is determined on the electric line by evaluating the cross-correlation function by means of a signal propagation observation.

Alternatively to using pseudorandom pulse sequences, the pulse sequence is made up of two different consecutive partial sequences, which are formed from code sequences complementary to each other, with two consecutive correlation functions, which are computed from the respective partial sequences, being added for determining the fault location.

The particularity of complementary codes is that two different codes always occur which are alternatingly transmitted in pairs. The autocorrelation function of the individual codes contains side lobes but the sum of the autocorrelation functions of both codes does not have any side lobes, which is advantageous for identifying the maximum in an unfavorable signal-to-noise ratio.

Furthermore, the frequency spectrum of the pseudorandom pulse sequence in the spectral range is limited by setting to zero values of a Fourier spectrum, which are above a settable threshold frequency.

Alternatively, the frequency spectrum of the pseudorandom pulse sequence in the time domain can be limited by a low-pass filtering using a settable threshold frequency.

The objective of the invention is further attained by a second method, which has the following method steps: generating a temporally limited ideal transmission signal from a harmonic signal having a Gauss-shaped envelope curve; transmitting the ideal transmission signal by means of a variably pre-settable transmission amplification; receiving and recording a real transmission signal by means of a first settable reception amplification while transmitting the ideal transmission signal; switching the first settable reception amplification on a second settable reception amplification which is greater than the first settable reception amplification; receiving a reflection signal by means of the second settable reception amplification; computing a cross-correlation function between the received real transmission signal and the received reflection signal; and determining the fault location on the electric line by evaluating the cross-correlation function by means of a propagation observation.

In contrast to the first method, in which the inevitable spectral spread of ideal transmission signals having pseudorandom pulse sequences is curbed by a subsequent spectral formation by means of low-pass filtering, a harmonic signal having a Gauss-shaped envelope curve (bandpass signal) is used as an ideal transmission signal in this second method.

On lines having a low-pass effect, it can be advantageous to use pulses having a very narrowband spectrum, in which pulses the group propagation and the line attenuation essentially only have to be known in one frequency. Harmonic signals having Gauss-shaped envelope curves present this property since their spectrum is strongly restricted owing to the energy concentration in the frequency range and does not reach to nearly reaches 0 Hz in contrast to the previously described low-pass signal forms. However, the price of the narrow spectrum is a vast blurriness of the autocorrelation function, i.e. a heavily oscillating autocorrelation function.

The further method steps of the second method, namely transmitting the ideal transmission signal, receiving and recording a real transmission signal, switching the settable reception amplification, receiving a reflection signal, computing a cross-correlation function and determining the fault location, correspond to the method steps of the first method.

By carrying out the second method, the objective is attained by a second circuit arrangement for localizing a fault location on an electric line, which is characterized by a signal generator for generating a temporally limited ideal transmission signal from a harmonic signal having a Gauss-shaped envelope curve; a transmission amplifier having a variably pre-settable and switchable transmission amplification and a transmission coupling circuit; a reception amplifier having a variably pre-settable reception amplification and a reception coupling circuit; a correlation receiver for computing a cross-correlation function between the received real transmission signal and the received reflection signal; and an evaluation unit for determining the fault location on the electric line.

BRIEF DESCRIPTION OF THE DRAWINGS

Further advantageous features of the embodiments are derived from the following description and the drawings, which describe a preferred embodiment of the invention by means of examples. In the following.

DETAILED DESCRIPTION

Figure 1:
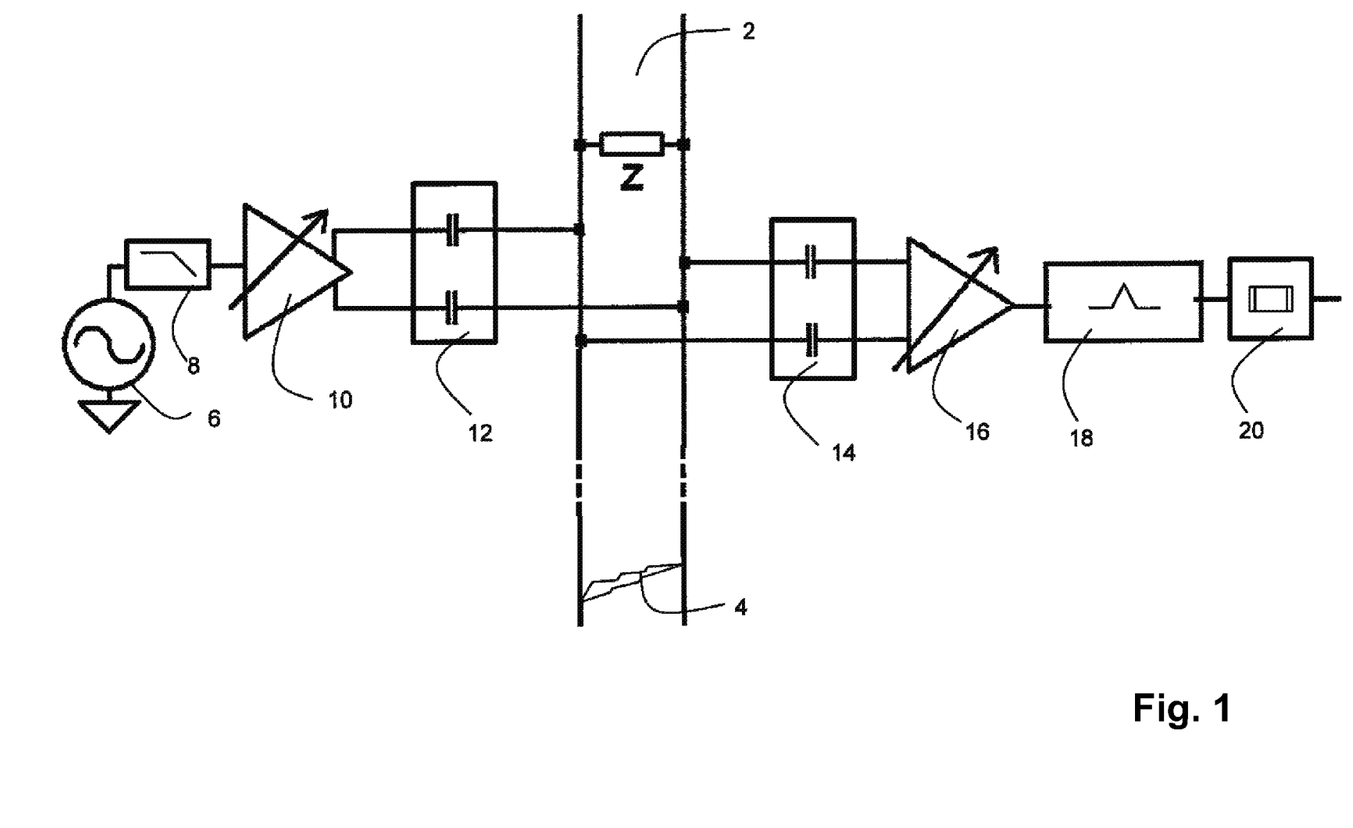
FIG. 1 illustrates a functional block diagram of the circuit arrangement according to the invention.

FIG. 1 illustrates a functional block diagram of the circuit arrangement according to the invention for identifying a fault location 4 on an electric line 2.

On the transmission side, the circuit arrangement comprises a signal generator 6 for generating a pseudorandom pulse sequence of the length M, said signal generator 6 comprising a code generator for generating a binary pseudorandom code sequence and for forming a temporally continuous signal form (wave-shape signal) from the binary pseudorandom code sequence and a square pulse generator.

The frequency spectrum of this wave-shape signal is limited in a filtering unit 8 so that a narrowband ideal transmission signal arises at the output of the filtering unit 8 from the in theory infinitely expanded spectrum of the pseudorandom pulse sequence.

When a harmonic signal having a Gauss-shaped envelope curve is used, the harmonic signal is already generated as an ideal transmission signal in the signal generator 6 and the band limitation via the filtering unit 8 is omitted.

The ideal transmission signal is coupled into the electric line 2 via a transmission amplifier 10 by means of a variably pre-settable transmission amplification and a transmission coupling circuit 12, which is carried out as a high pass.

The electric line 2 is supplied with the grid impedance Z via a power supply system (not illustrated). The grid impedance can be heavily dependent on frequency and temporally variable and influences the size and the shape of the real transmission signal, cf. FIG. 5.

On the reception side, the reflected signal or this transmission signal as well, the latter while transmitting the ideal transmission signal according to the invention, is received as a real transmission signal via a reception coupling circuit 14 carried out as a high pass and a reception amplifier 16 having a variably pre-settable and switchable reception amplification. The received real transmission signal is recorded for the usage of correlation computation in a data storage device for this purpose.

In a correlation receiver 18, the cross-correlation function is computed between the received real transmission signal and the received reflection signal.

An evaluation unit 20 undertakes the evaluation of the cross-correlation function by means of a signal propagation observation in order to determine the fault location on the electric line.

The function blocks, in particular the signal generator 6, the filtering unit 8, the correlation receiver 18 and the evaluation unit 20, are realized either as a software implementation on a micro or signal processor or in digital function components as programmed hardware, such as in FPGAs or ASICs.

Figure 2A:
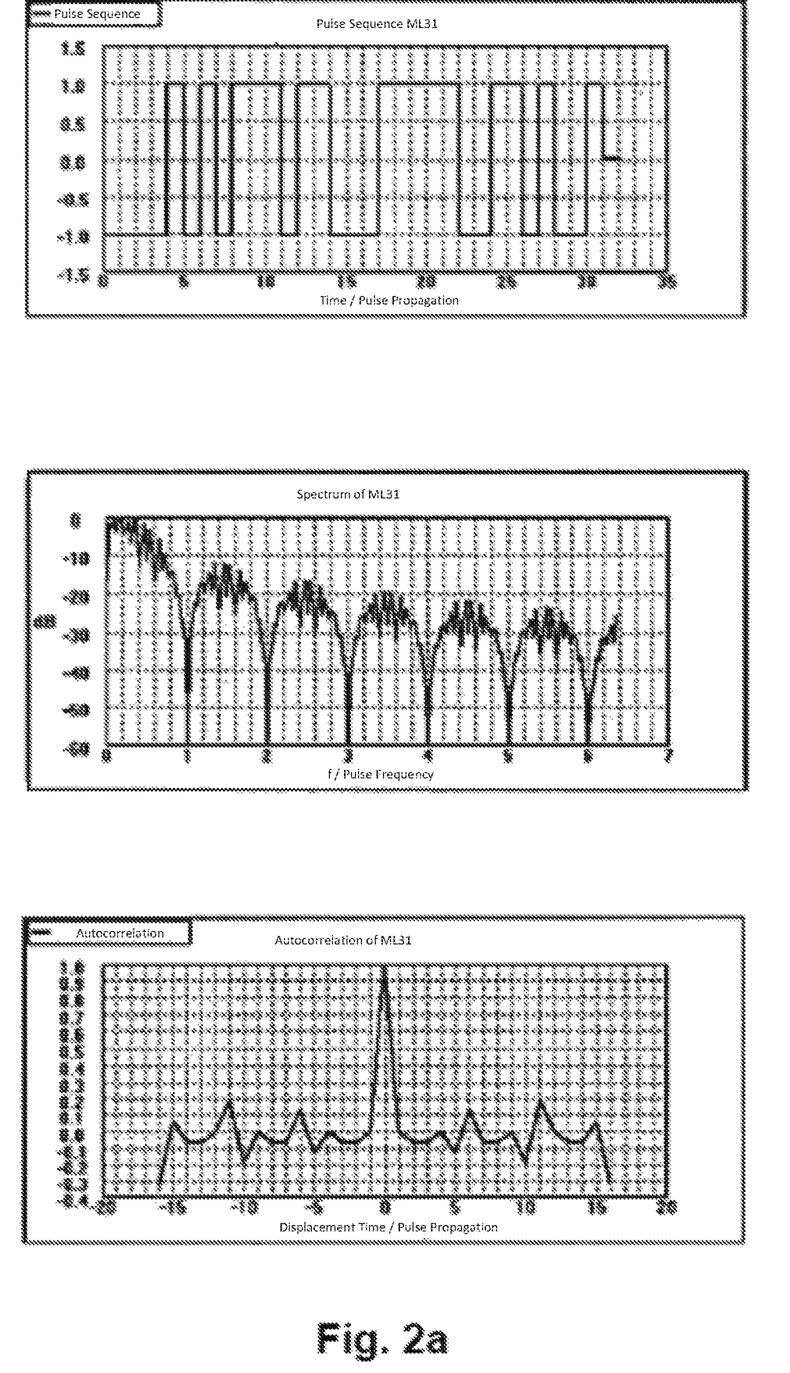
FIG. 2a illustrates a pseudorandom pulse sequence having a spectrum and an autocorrelation function on the basis of a maximum sequence.

A pseudorandom pulse sequence starting from a maximum sequence of the length M=31 in the time domain as well as its spectrum and its autocorrelation function is illustrated in FIG. 2a. The pseudorandom pulse sequence does have an expanded broadband spectrum but also has an advantageous autocorrelation property having a distinct narrow maximum.

Figure 2B:
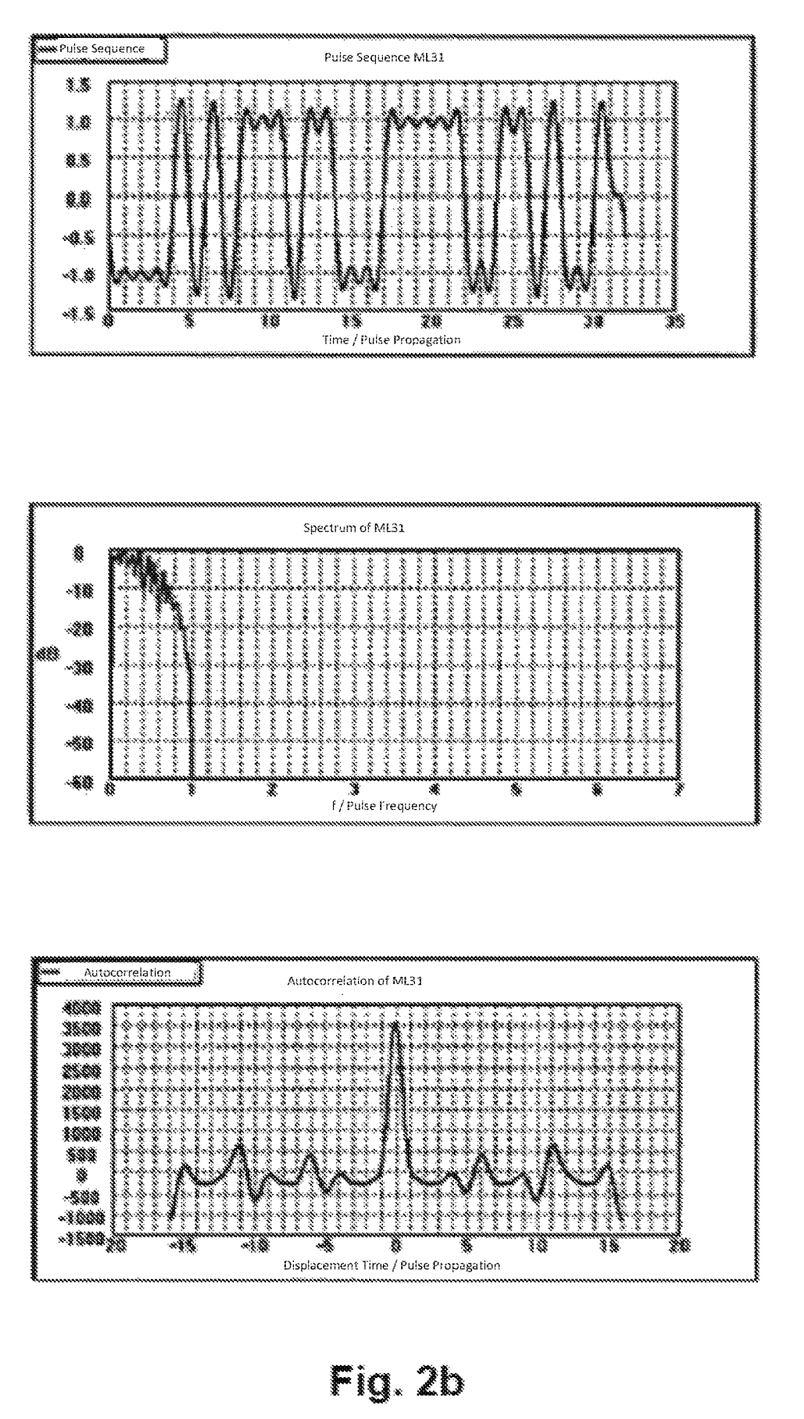
FIG. 2b illustrates the pseudorandom pulse sequence from FIG. 2a having band limitation in the frequency range as an ideal transmission signal.

FIG. 2b illustrates the pseudorandom pulse sequence from FIG. 2a as an ideal transmission signal having band limitation in the frequency range. The band limitation is carried out by setting to zero values of the Fourier spectrum above a settable threshold frequency. As a threshold frequency, the pulse frequency was chosen which corresponds to the reciprocal value of a symbol duration which can be derived from the duration of the M individual pulses.

As a result, it can be seen that the distinct band limitation does lead to overshoots in the time domain but only takes effect in an unsubstantial expansion of the maximal value of the autocorrelation function.

Thus, a reliable localization of the fault location on the electric line is possible even having a narrowband EMC-suitable transmission signal, which is adjusted to the expansion conditions on the electric line and can be easily amplified.

Figure 2C:
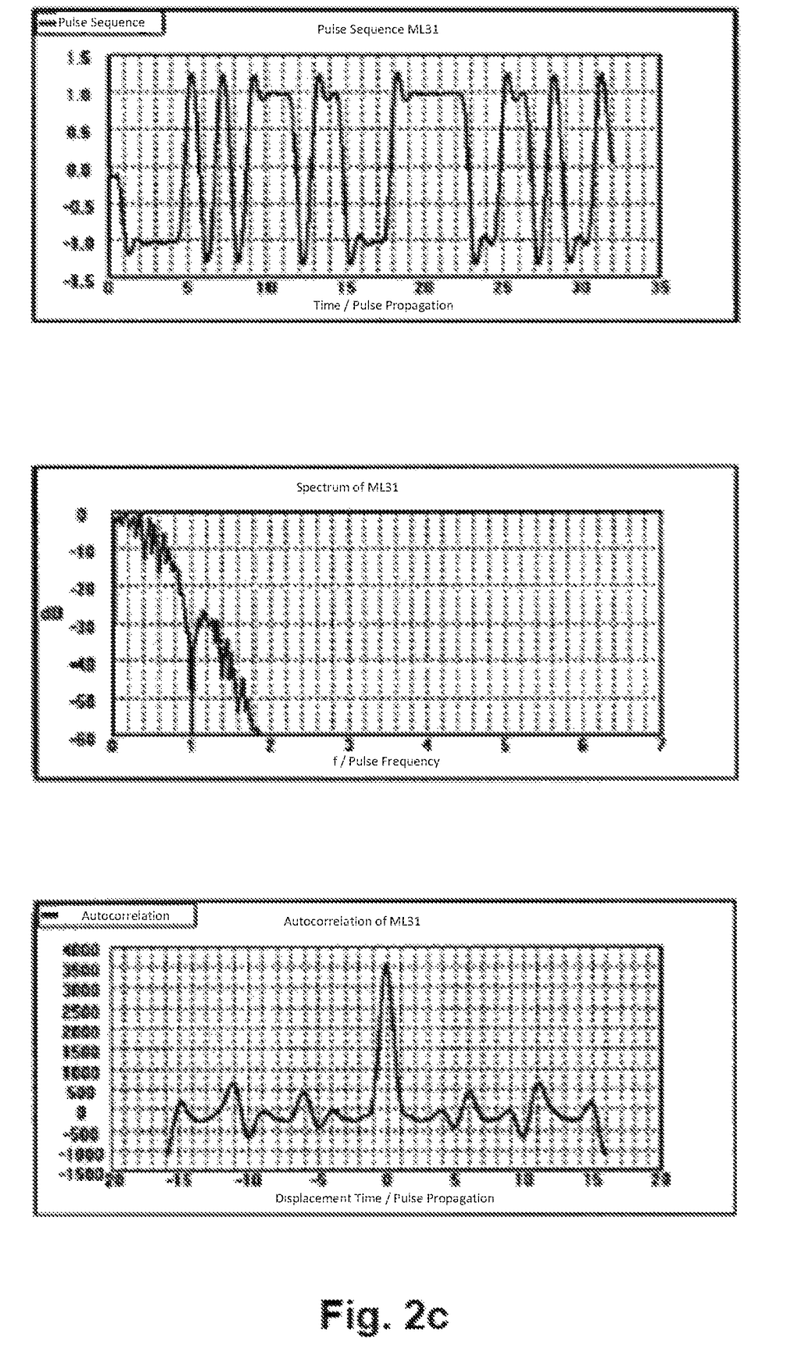
FIG. 2c illustrates the pseudorandom pulse sequence from FIG. 2a having band limitation in the time domain as an ideal transmission signal.

A similarly positive effect is caused by the pseudorandom pulse sequence from FIG. 2a illustrated in FIG. 2c having band limitation via a low-pass filtering by means of a settable threshold frequency in the time domain.

In this instance, the threshold value also approximately corresponds to the reciprocal value of a symbol duration.

Figure 3A:
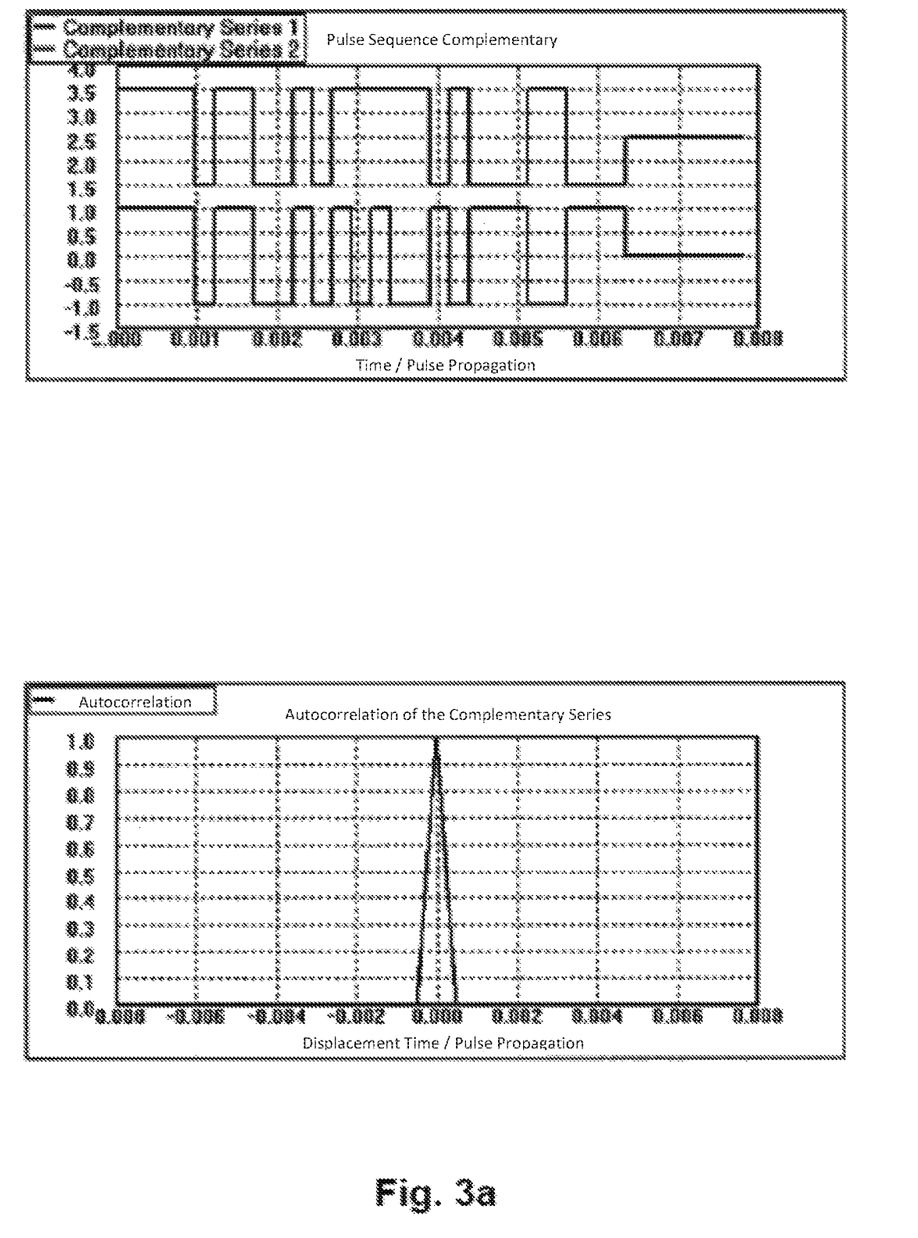
FIG. 3a illustrates a pseudorandom pulse sequence having an autocorrelation function based on complementary codes.

In FIG. 3a, a pseudorandom pulse sequence is illustrated having an autocorrelation function based on two codes complementary to each other. The illustrated autocorrelation function is derived from the sum of the temporally consecutively detected autocorrelation functions of the respective pseudorandom pulse sequence (partial sequence). For determining the fault location, the cross-correlation function of the reflection signal is thus first formed by means of the initially transmitted pseudorandom pulse sequence (based on a first code sequence) and then the cross-correlation function of the reflection signal is formed by means of the subsequently transmitted pseudorandom pulse sequence (based on a second code sequence) and subsequently both cross-correlation functions are added.

The result shows a (sum) correlation function which is free of side lobes and thus reliably ensures determining the fault location.

The usage of complementary codes can be modified under practical aspects such as EMC and adjustments to the expansion conditions on the line to such an extent that measures previously described for the maximum sequences are taken for band limitation in order to generate an ideal transmission signal.

Figure 3B:
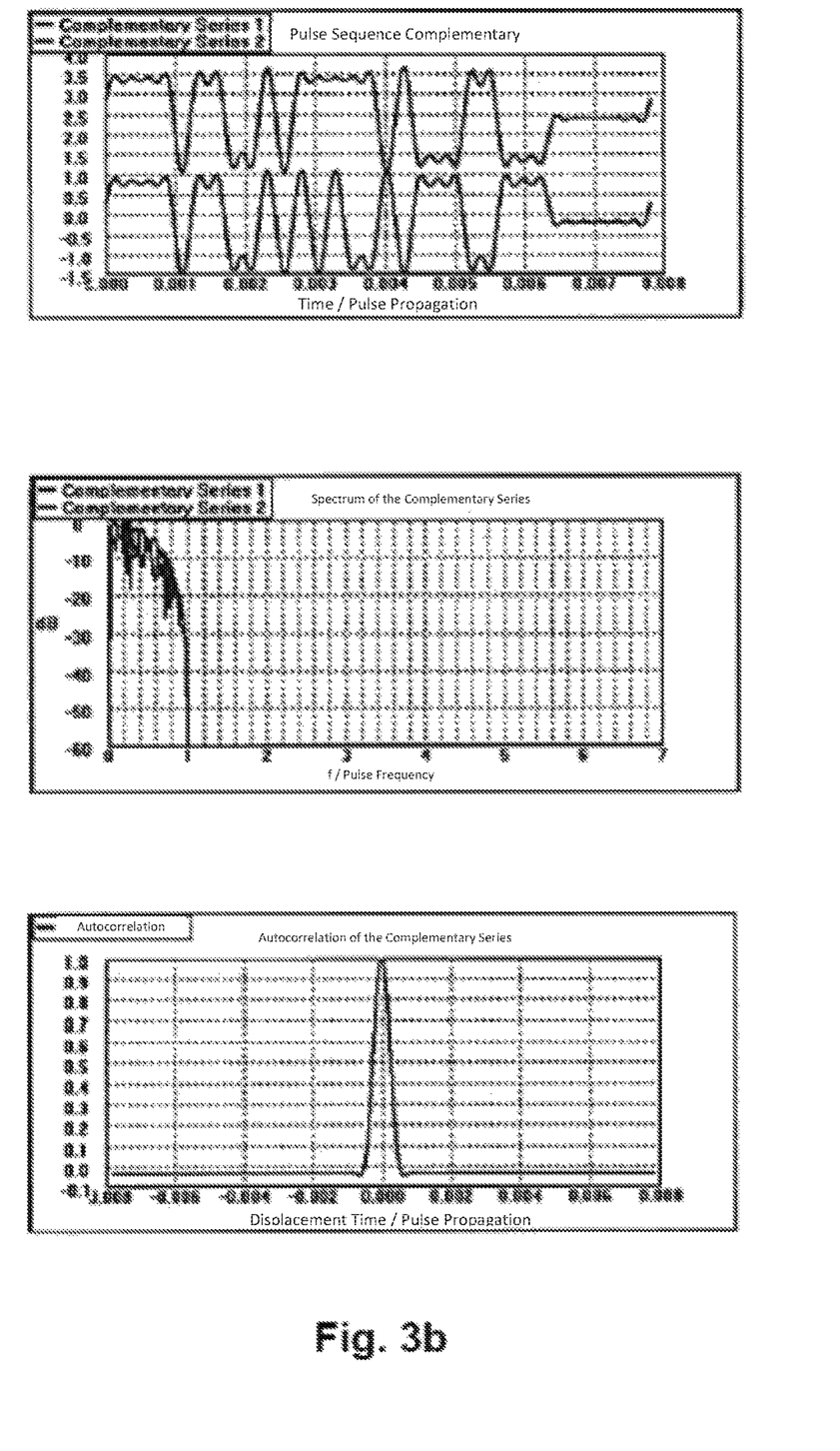
FIG. 3b illustrates the pseudorandom pulse sequence from FIG. 3a having band limitation in the frequency range as an ideal transmission signal.

FIG. 3b illustrates in an exemplary manner the band limitation by setting to zero values of the Fourier spectrum, which are above a settable threshold value. Only a slight expansion of the maximal value of the autocorrelation function can be identified.

Figure 4:
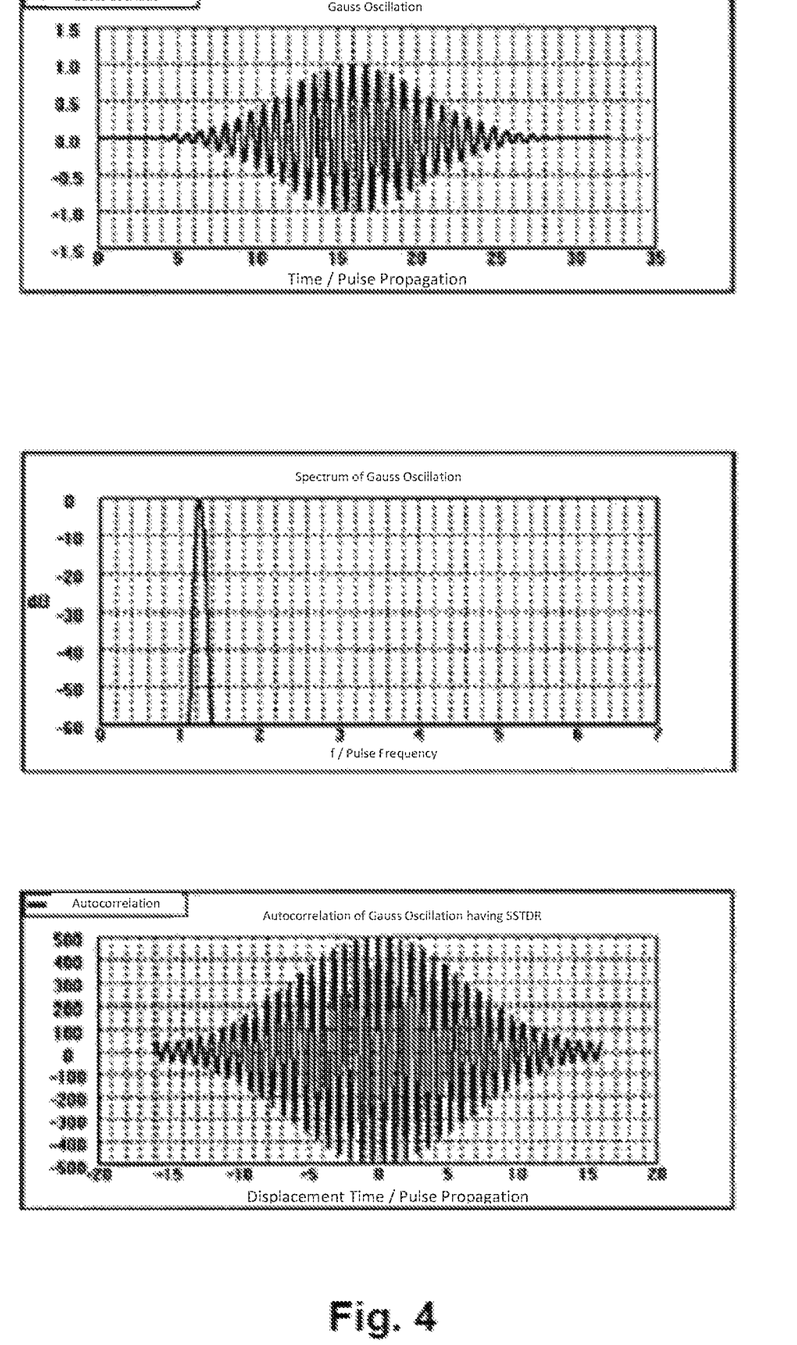
FIG. 4 illustrates a harmonic signal having a Gauss-shaped envelope curve as an ideal transmission signal.

In FIG. 4, a harmonic signal having a Gauss-shaped envelope curve is illustrated. This signal is a narrowband bandpass signal as the spectral representation shows and thus fulfills the requirements regarding the EMC and adjustments to the expansion conditions on the line. A heavily oscillating autocorrelation function connected thereto can be evaluated using an envelope curve receiver for detecting the maximum in a simple manner.

Figure 5:
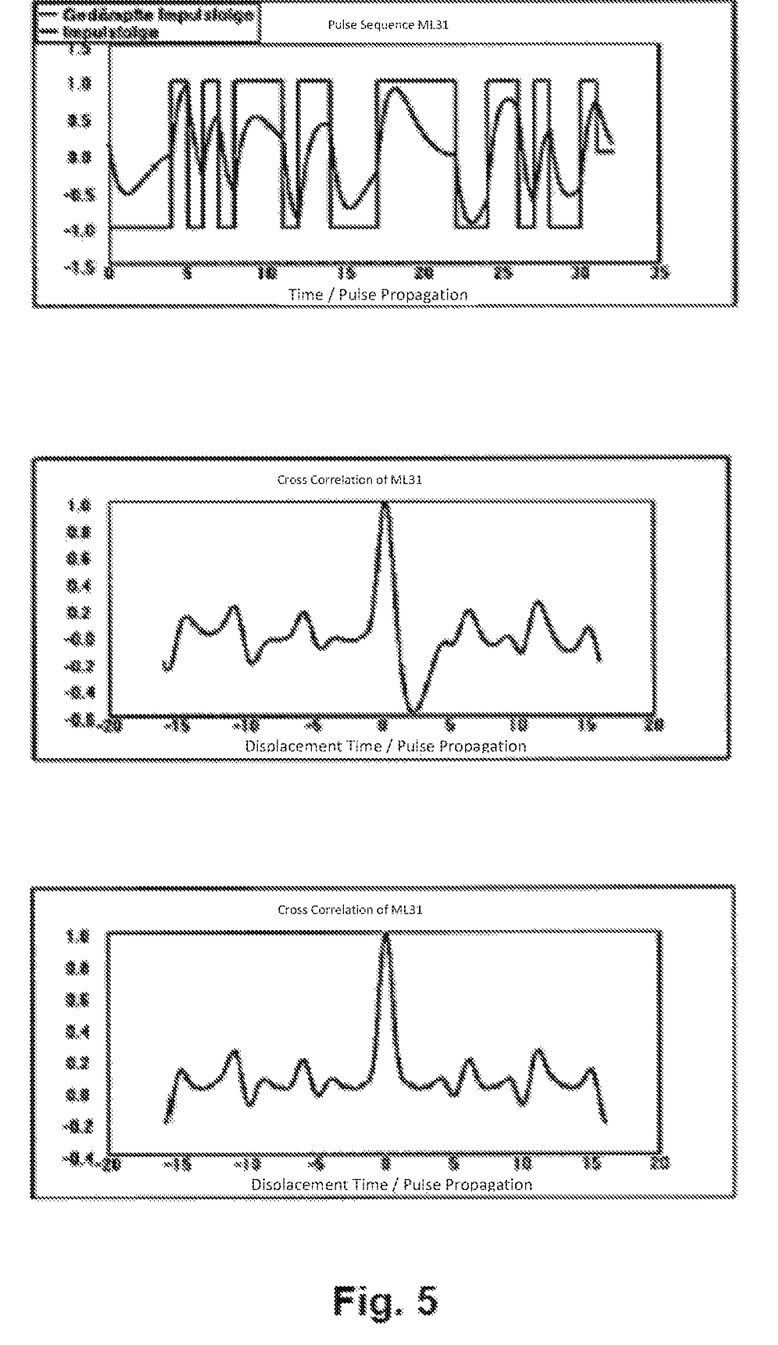
FIG. 5 illustrates a real transmission signal.

FIG. 5 illustrates a real transmission signal (rounded signal shape in first diagram) in contrast to a pseudorandom pulse sequence (square signal shape in first diagram) and the resulting cross-correlation functions of the reflection signal having the ideal transmission signal (second diagram) or having the real transmission signal (third diagram). More favorable correlation properties can be seen which present themselves in an obvious and symmetric maximal value of the cross-correlation function if the real transmission signal derived from the ideal transmission signal is used for correlation instead of the ideal transmission signal. This is explained by the real transmission signal already taking into account the pulse distortions in the transmission coupling switch as a consequence of the complex-valued grid impedance and via the pulse distortions in the receiver coupling switch and thus being more similar to the reflection signal.

The invention claimed is:

1. A method for localizing a fault location on an electric line according to a method of time-domain reflectometry, having the following method steps:
    generating a pseudorandom pulse sequence of a length M,
    generating an ideal transmission signal from the pseudorandom pulse sequence by limiting a frequency spectrum of the pseudorandom pulse sequence,
    transmitting the ideal transmission signal by means of a variably pre-settable transmission amplification,
    receiving and recording a real transmission signal by means of a first settable reception amplification while transmitting the ideal transmission signal,
    switching the first settable reception amplification to a second settable reception amplification which is greater than the first settable reception amplification,
    receiving a reflection signal by means of the second settable reception amplification,
    computing a cross-correlation function between the received real transmission signal and the received reflection signal,
    determining the fault location on the electric line by evaluating the cross-correlation function by means of a signal propagation observation.

2. The method according to claim 1, characterized in that the pseudorandom pulse sequence is generated from two consecutive partial sequences which are made of code sequences complementary to each other, and in that two consecutive correlation functions, which are computed from the respective partial sequences, are added for determining the fault location.

3. The method according to claim 1, characterized in that the frequency spectrum of the pseudorandom pulse sequence in the spectral range is limited by setting to zero values of a Fourier spectrum, which are above a settable limit frequency.

4. The method according to claim 1, characterized in that the frequency spectrum of the pseudorandom pulse sequence in the time range is limited by a low-pass filtering using a settable limit frequency.

5. A circuit arrangement for carrying out a method for localizing a fault location on an electric line according to the claim 1, characterized by a signal generator for generating a pseudorandom pulse sequence, a filtering unit for limiting a frequency spectrum of the pseudorandom pulse sequence, a transmission amplifier having a variably pre-settable transmission amplification and a transmission coupling circuit, a reception amplifier having a variably pre-settable and switchable reception amplification and a reception coupling circuit, a correlation receiver for computing a cross-correlation function between the received real transmission signal and the received reflection signal and
    an evaluation unit for determining the fault location on the electric line.

6. The circuit arrangement according to claim 5, characterized in that the filtering unit is configured for computing a Fourier spectrum of the pseudorandom pulse sequence and for filtering in the spectral domain.

7. The circuit arrangement according to claim 5, characterized in that the filtering unit comprises a low-pass filter structure for filtering in the time domain.

* * * * *